(12) United States Patent
Yelkin et al.

(10) Patent No.: US 11,322,344 B2
(45) Date of Patent: May 3, 2022

(54) METHOD AND DEVICE FOR THE REDUCTION OF CONTAMINANTS IN A PLASMA REACTOR, ESPECIALLY CONTAMINATION BY LUBRICANTS

(71) Applicant: Plasma Investment Sp. z o.o, Wroclaw (PL)

(72) Inventors: Ihar Yelkin, Wroclaw (PL); Edward Reszke, Wroclaw (PL); Grzegorz Binkiewicz, Skarbimierz (PL)

(73) Assignee: Plasma Investment Sp. z o.o., Wroclaw (PL)

( * ) Notice: Subject to any disclaimer, the term of this patent is extended or adjusted under 35 U.S.C. 154(b) by 0 days.

(21) Appl. No.: 17/270,612

(22) PCT Filed: Aug. 21, 2019

(86) PCT No.: PCT/PL2019/000070
§ 371 (c)(1),
(2) Date: Feb. 23, 2021

(87) PCT Pub. No.: WO2020/040654
PCT Pub. Date: Feb. 27, 2020

(65) Prior Publication Data
US 2021/0183640 A1     Jun. 17, 2021

(30) Foreign Application Priority Data
Aug. 24, 2018 (PL) .................................... P.426786

(51) Int. Cl.
*H01J 61/28* (2006.01)
*H01J 9/38* (2006.01)
(Continued)

(52) U.S. Cl.
CPC ............... *H01J 61/28* (2013.01); *H01J 9/38* (2013.01); *H01J 9/50* (2013.01); *H01J 37/32018* (2013.01); *H01J 2237/022* (2013.01)

(58) Field of Classification Search
CPC .......................... H01J 61/28; H01J 37/3208
See application file for complete search history.

(56) References Cited

U.S. PATENT DOCUMENTS 5,176,558 A     1/1993   Newell
2003/0051990 A1  3/2003  Spielman et al.

FOREIGN PATENT DOCUMENTS

EP     0366876 A1       5/1990
KR     20150119686 A  * 10/2015

OTHER PUBLICATIONS

International Search Report and Written Opinion of the ISA/EP in PCT/US2019/041840, dated Dec. 12, 2019; 11 pgs.
(Continued)

*Primary Examiner* — Joseph L Williams
(74) *Attorney, Agent, or Firm* — Haukaas Fortius PLLC; Michael H. Haukaas

(57) ABSTRACT

The subject of the invention is a method and device for reducing contamination in a plasma reactor, especially contamination by lubricants, particularly for plasma processing of materials. The method is based on the fact that the contaminated gas pumped out of at least one reduced pressure vacuum chamber in the form of a plasma lamp ($LA_1$, $LA_2$, $LA_3$) is purified in at least one purifying plasma lamp ($LA_{O1}$, $LA_{O2}$, $LA_H$, $LA_E$), in which a glow discharge is initiated between the anodes of the purifying plasma lamp ($A01$, $A02$) and the cathodes of the purifying plasma lamp ($K_{O1}$, $K_{O2}$), favorably particles of lubricants are cracked and partially polymerized, while processed heavy particles of lubricants are collected in a buffer tank (ZB) and then discharged outside the pumping system. The device contains
(Continued)

Figure 1:
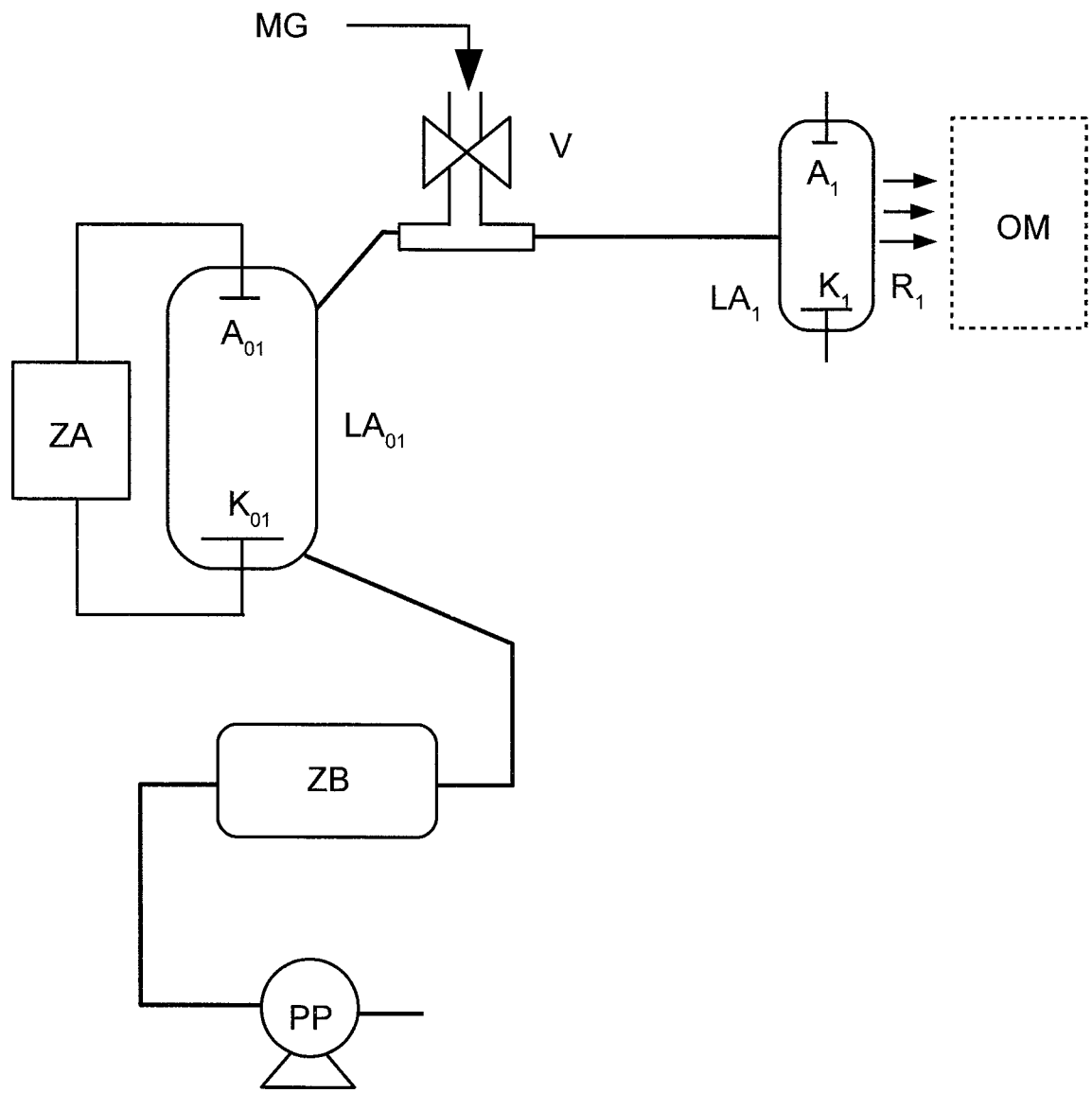

at least one reduced pressure vacuum chamber in the form of a plasma lamp ($LA_1$, $LA_2$, $LA_3$), it is connected to at least one purifying plasma lamp ($LA_{01}$, $LA_{02}$, $LA_H$, $LA_E$) with a buffer tank (ZB) connected to a vacuum pump (PP). The vacuum tube connecting the plasma lamps ($LA_1$, $LA_2$, $LA_3$) with the purifying plasma lamp ($LA_{01}$, $LA_{02}$, $LA_H$, $LA_E$)) is equipped with a dosing valve (V) for the gaseous admixture medium (MD) to plasma lamps ($LA_1$, $LA_2$, $LA_3$), from which radiation ($R_1$, $R_2$, $R_3$) is directed to the processed material (OM).

6 Claims, 4 Drawing Sheets

(51) Int. Cl.
    *H01J 9/50*         (2006.01)
    *H01J 37/32*       (2006.01)

(56) References Cited

OTHER PUBLICATIONS

Response to Rules 161(1) and 162 EPC Communication in the European Patent Office for European Patent Application No. 19783751. 1, dated Oct. 15, 2021, 8pgs.

\* cited by examiner

METHOD AND DEVICE FOR THE REDUCTION OF CONTAMINANTS IN A PLASMA REACTOR, ESPECIALLY CONTAMINATION BY LUBRICANTS

CROSS-REFERENCE TO RELATED APPLICATIONS

This application is a National Stage filing under 35 U.S.C. § 371 of International Application No. PCT/PL2019/000070, filed Aug. 21, 2019, which claims the benefit of Polish Patent Application No. P.426786 filed Aug. 24, 2018, which applications are incorporated herein by reference in their entirety.

The subject of the invention is a method and device for reducing contamination in a plasma reactor, especially contamination by lubricants, particularly for plasma processing of materials.

The method and device for the control of contaminants in the plasma reactor are known from the European patent application no. EP0425419. The method involves the use of electrostatic, electromagnetic, mechanical, thermal, pressure, hygroscopic or chemical means to eliminate particle contamination in situ in the plasma reactor system, mainly used in plasma etching, very sensitive to contamination coming from the outside of the system as well as from internal chemical and mechanical sources. One variant of the method is that a plasma purification process is performed by applying RF voltage in order to set the plasma in the reactor, followed by a periodical RF voltage switching for a short period of time and RF voltage reapplication, providing cyclical momentary breaks in RF voltage and plasma as well as continuous alternating RF voltage application with short breaks until completion of the plasma process. The RF power supply unit is periodically keyed. The plasma reactor system includes control electronics for generating impulses for the RF voltage source. Another variant is to create a pre-process plasma, which is a glow discharge of RF type in an electrodeless inductive reactor, in which there is only a plasma sheath type density gradient resulting from ambipolar diffusion and a temperature gradient in the direction of gas flow. In this variant, the plasma is induced by a coil supplied with energy from the power supply, which is fed into the chamber to remove water formed by the fragmentation of hydrated components such as OH or hydrocarbon impurities in the feed gases. In this solution, water, oxygen or absorbed organic chemicals are reduced when operating the reaction gas, and water or absorbed organic chemicals are reduced inside the plasma by exposing them to $CF_4$ or $NF_6$ plasma.

The essence of the method according to the invention is that the polluted gas pumped out of at least one vacuum chamber with reduced pressure in the form of a plasma lamp is purified in at least one purifying plasma lamp, in which between the anode of the purifying plasma lamp and the cathode of the purifying plasma lamp a glow discharge is initiated, favorably particles of the lubricants are cracked and the partially polymerized processed heavy particles of lubricants are accumulated in a buffer tank and later are discharged outside the pumping system.

The essence of the device according to the invention is that at least one chamber with a reduced pressure in the form of a plasma lamp is connected with at least one purifying plasma lamp and a buffer tank connected to a vacuum pump, in addition, a vacuum tube connecting plasma lamps with a purifying plasma lamp is equipped with a valve dosing the gaseous admixture medium to plasma lamps, from which radiation is then directed to the processed material.

Favorably, the purifying plasma lamps are connected by a vacuum tube in series.

Favorably, the first and the second plasma purifying lamps are connected to the power supply in parallel.

Favorably, the purifying plasma lamp is a purifying H-type electrodeless plasma lamp, which is connected to a radio frequency power generator.

Favorably, the purifying plasma lamp is a purifying E-type electrodeless plasma lamp, which is connected to a radio frequency power generator.

The device for reducing contamination in a plasma reactor, especially contamination by lubricants, according to the invention, which uses purifying plasma lamps, makes it possible to guarantee a long service life of process plasma lamps, which in practice extends it even a thousand times. Application of the invention to vacuum processes of microelectronics may result in further multiplication of atomic purity of the process allowing to achieve new technical limits, previously considered impossible to be reached. In processes requiring particularly high purity, it is worth using at least one lamp of the electrodeless type located closest to valve V, from the inside of which the electrodes were removed and placed outside, shaping them in a way that using the energy of radio waves could generate plasma discharge type E (in an electric field) or type H (in a magnetic field).

Figure 2:
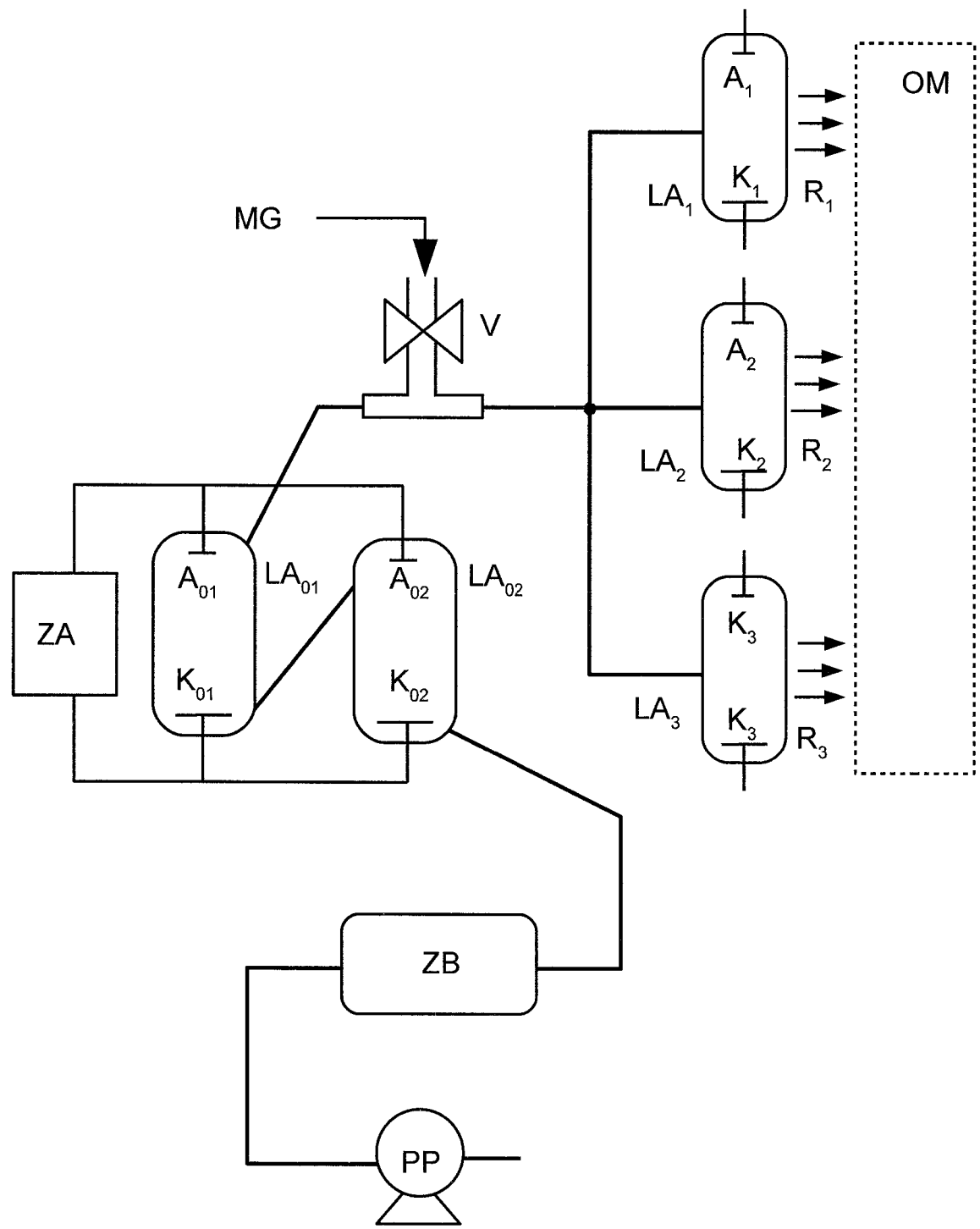
Figure 3:
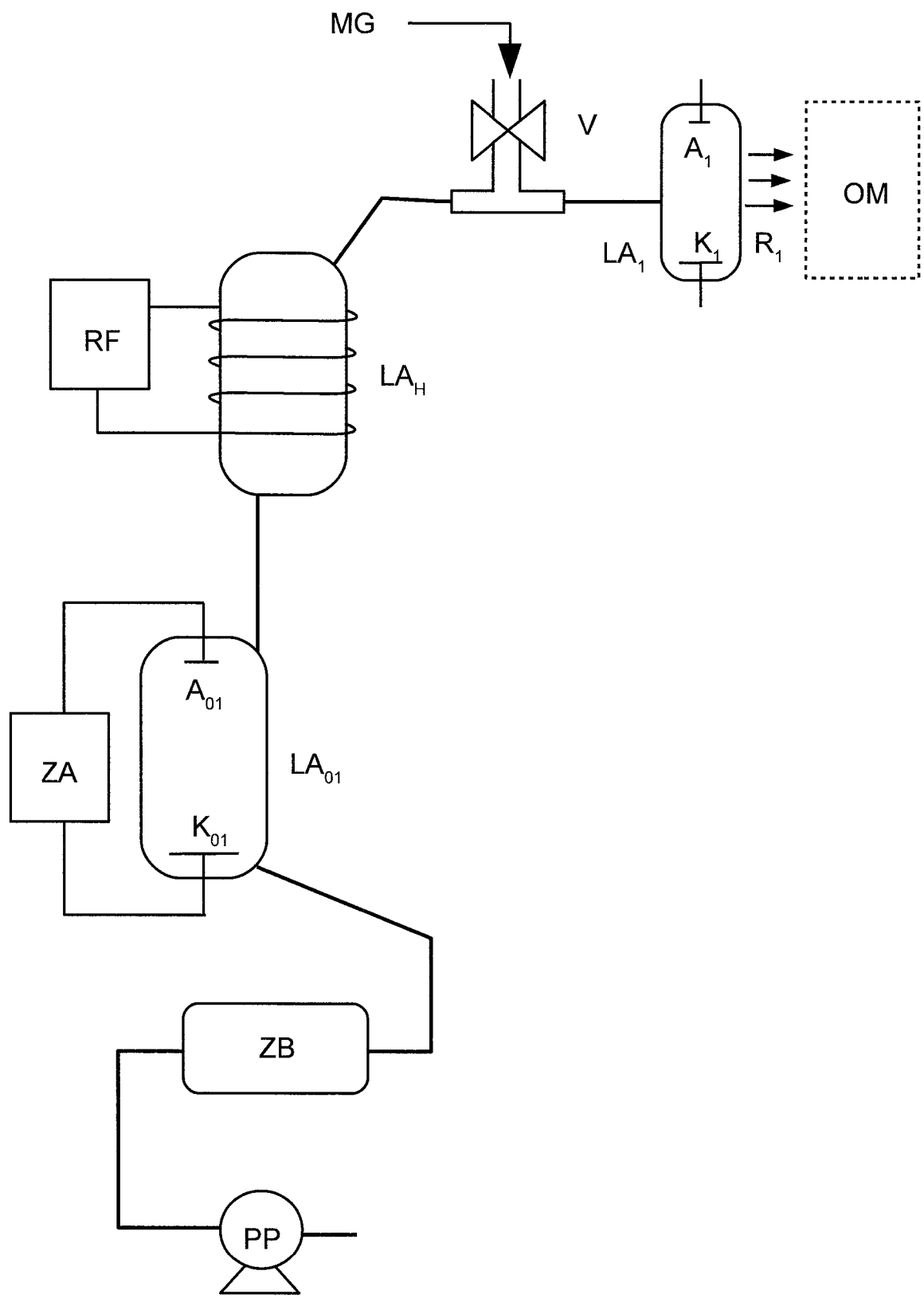
Figure 4:
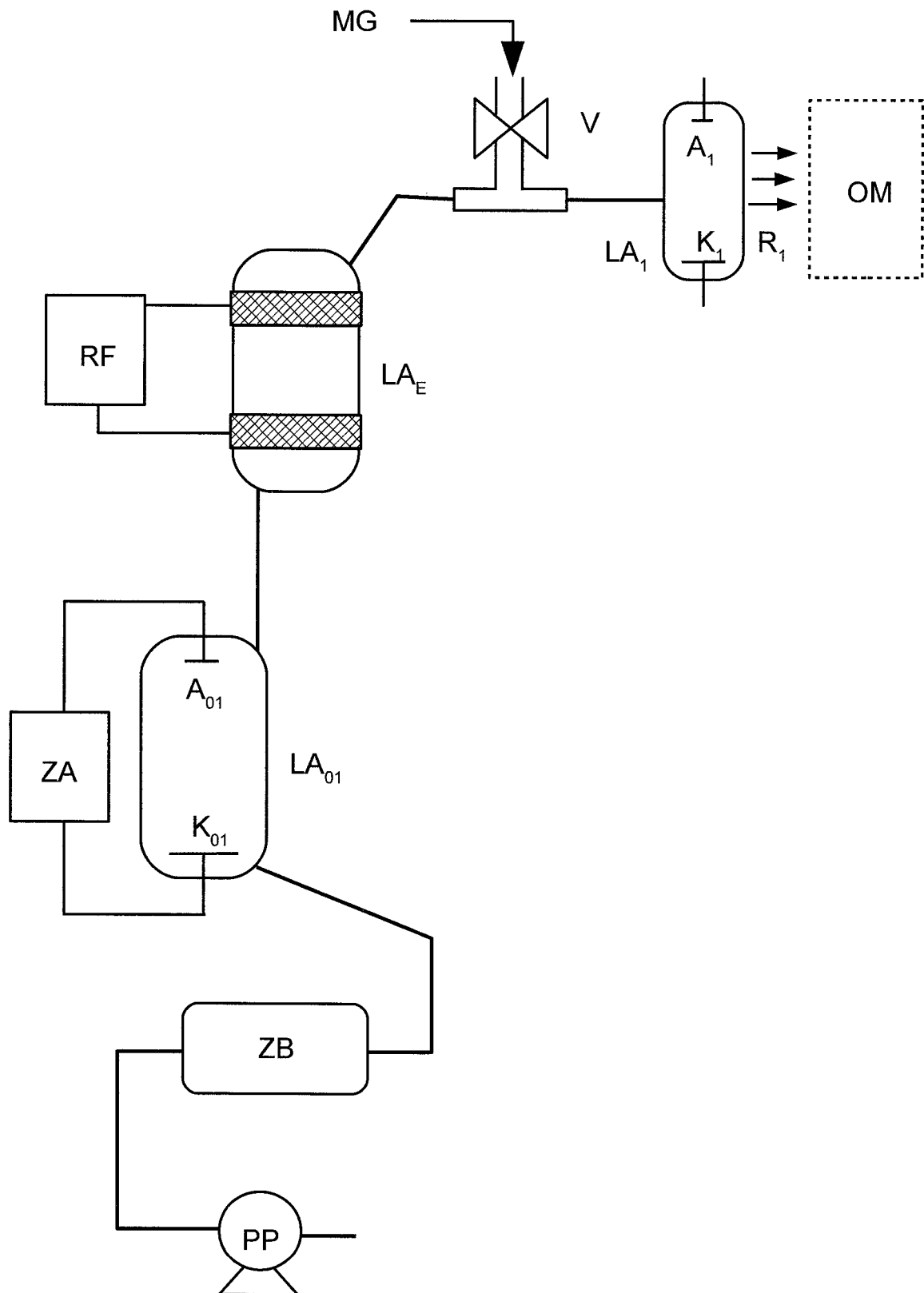

The subject of the invention is explained in the examples of execution and shown in the figure where FIG. 1 presents a device reducing contaminants in a plasma reactor with one purifying plasma lamp, FIG. 2—a device reducing contaminants in a plasma reactor with two purifying plasma lamps, FIG. 3—a device reducing contaminants in a plasma reactor with one purifying plasma lamp connected in series through a vacuum tube to a purifying H-type electrodeless plasma lamp, and FIG. 4—a device reducing contaminants in a plasma reactor with one purifying plasma lamp connected in series through a vacuum tube to a purifying E type electrodeless plasma lamp.

EXAMPLE 1

The method for reduction of contamination in a plasma reactor, especially contamination with lubricants, is based on the fact that the vacuum pump PP pumps out the contaminated gas from a chamber with a reduced pressure in the form of the first plasma lamp $LA_1$, after which the contaminated gas is purified in the first purifying plasma lamp $LA_{01}$ connected to the power supply ZA, in which a glow discharge is initiated between the anode of the purifying plasma lamp $A_{01}$ and the cathode of the purifying plasma lamp $K_{01}$ and particles of lubricants are cracked and partially polymerized, while the processed heavy particles of lubricants are collected in the buffer tank ZB, and later discharged outside the pumping system.

EXAMPLE 2

The method of reducing contamination in a plasma reactor, especially contamination by lubricants, is the same as in the first example with the difference that the contaminated gas pumped out of the three plasma lamps the first $LA_1$, second $LA_2$ and third $LA_3$, is purified in two purifying plasma lamps, the first $LA_{01}$ and the second $LA_{02}$, connected in series by vacuum tubes, in which the glow discharge is initiated between the anodes of the purifying plasma lamps, the first $A_{01}$ and the second $A_{02}$, and the purifying cathodes of the plasma lamps, the first $K_{01}$ and the second $K_{02}$, by means of the power supply ZA, after which the particles of lubricants are cracked in the first purifying plasma lamp $LA_{01}$ and then in the second purifying plasma lamp $LA_{02}$.

EXAMPLE 3

The device for reducing contaminants in the plasma reactor, especially the contamination by lubricants, is equipped with a PP vacuum pump connected to the ZB buffer tank connected to the plasma discharge lamp $LA_{01}$, which is a specific gas purifier and is equipped with the anode of the first purifying plasma lamp $A_{01}$ and the cathode of the first purifying plasma lamp $K_{01}$. The first purifying plasma lamp $LA_{01}$, on the side of the anode of the first purifying plasma lamp $A_{01}$, is connected to the dosing valve V, to which the gaseous admixture medium MD, which may be especially humid atmospheric air, is supplied. The first plasma lamp $LA_1$ is connected to the V dosing valve, the electrodes of which are powered from an independent power source. The first plasma lamp $LA_1$, generates radiation of the first plasma lamp $R_1$, which is directed at the material being processed OM. The processed material OM can be a liquid, biological substances or the body of a living organism.

EXAMPLE 4

The device for reducing contaminations in the plasma reactor, especially the contamination by lubricants, is designed as in the third example, except that it has three plasma lamps, the first $LA_1$, the second $LA_2$ and the third $LA_3$, connected to two purifying plasma lamps, the first $LA_{01}$ and the second $LA_{02}$, where the purifying plasma lamps, the first $LA_{01}$ and the second $LA_{02}$, are connected by a vacuum tube in series, while the anodes of the purifying plasma lamps of the first $A_{01}$ and the second $A_{02}$ and the cathodes of the purifying plasma lamps of the first $K_{01}$ and the second $K_{02}$ are connected in parallel by a power supply ZA. Moreover, the V dosing valve is supplied with the first $LA_1$, the second $LA_2$, and the third $LA_3$ plasma lamps, the electrodes of which are powered from independent power sources. The first $LA_1$, the second $LA_2$, and the third $LA_3$ plasma lamps generate radiation: plasma lamp radiation of the first plasma lamp $R_1$, the second plasma lamp $R_2$, and the third plasma lamp $R_3$, which is directed at the processed material OM. The processed material OM can be a liquid, biological substances or the body of a living organism.

EXAMPLE 5

The device for reducing contaminants in a plasma reactor, especially contamination by lubricants, is designed as in the fourth example, with the difference that the second purifying plasma lamp $LA_{02}$ is an electrodeless purifying plasma lamp of H-type $LA_H$ with a dominant coupling using an inductor, which is connected to RF power generator with a frequency of 1-50 MHz and a power of 20 W.

EXAMPLE 6

The device for reducing contaminants in a plasma reactor, especially contamination by lubricants, is designed as in the fourth example, with the difference that the second purifying plasma lamp $LA_{02}$ is a purifying electrodeless plasma lamp of E-type $LA_E$ with a dominant coupling of an electric field by means of two rings, which are connected to a RF power generator with a frequency of 1-50 MHz and a power of 20 W.

The operation of the device is as follows: with the use of a vacuum pump PP in the first plasma cleaning lamp $LA_{01}$, a dynamic vacuum is obtained, the level of which is smoothed by means of a buffer tank ZB. At this vacuum level of 0.1 to 200 Pa, a glow discharge is induced between the anode of the first purifying plasma lamp $A_{01}$ and the cathode of the first purifying plasma lamp $K_{01}$, with the anode current being in the range of 10 µA to 50 mA (DC). To increase the purifying efficiency, the first $LA_{01}$ plasma purifying lamp, and possibly subsequent lamps, are used. The most important contaminant removed by the use of the first plasma cleaning lamp $LA_{01}$ are oil vapors or other micro-particles from the vacuum pump PP. Firstly, the barrier formed by the plasma discharge breaks down (cracks) particles of lubricants and partially polymerizes them. Secondly, due to the unidirectional flow of the discharge current, preferably abnormal, the anode of the first purifying plasma lamp $LA_{01}$ sends a stream of ions towards the cathode of the first purifying plasma lamp $K_{01}$ and thus an imbalance is created, because the 'ionic wind' is also a kind of a pump, which pushes the heavier gas particles back to the buffer tank ZB. Another mechanism explaining the positive effect of the method and device according to the invention is connected with the fact that the speed of heavy individuals in the first plasma purifying lamp $LA_{01}$ is increased due to the gas dilution. In valve V, where the gaseous admixture medium MD is dosed, the equilibrium concentration of gas is determined, which is then introduced into the first $LA_1$, the second $LA_2$, and the third $LA_3$ process plasma lamps, and this gas is free of contaminants coming from the vacuum pumping system with the vacuum pump PP and from the buffer tank ZB. From a practical point of view, the sequence of connections of the individual elements of the device shown in FIG. 1 is at the same time an expression of their geometric distribution in relation to the height of the drawing. With the V valve and the inlet of the gaseous medium MD placed at the top of the device, and the buffer tank ZB and the vacuum pump PP placed at the bottom, you can additionally force a favorable enrichment of the gas supplied to the process lamps, the first $LA_1$, the second $LA_2$, and the third $LA_3$, with lightweight components, of which an important role is played by electropositive hydrogen H+ and helium He+, which are recycled after a collision with positive anode spatial charge in the first purifying plasma lamp $LA_{01}$, while the components in the form of heavy atomic gases such as Ar, Kr, Ne, as well as heavier molecules $N_2$, $O_2$ can be eliminated somehow mechanically as more easily 'pumpable' by a vacuum pump PP.

LIST OF MARKINGS ON THE FIGURE

PP—vacuum pump,
ZB—buffer tank,
$LA_{01}$—the first purifying plasma lamp,
$LA_{02}$—the second purifying plasma lamp,
$LA_{01}$—anode of the first purifying plasma lamp,
$A_{02}$—anode of the second purifying plasma lamp,
$K_{01}$—cathode of the first purifying plasma lamp,
$K_{02}$—cathode of the second purifying plasma lamp,
V—dosing valve,
MD—gaseous admixture medium,
$LA_1$—the first plasma lamp, $LA_2$—the second plasma lamp,
$LA_3$—the third plasma lamp,
$A_1$—anode of the first plasma lamp,
$A_2$—anode of the second plasma lamp,
$A_3$—anode of the third plasma lamp,
$K_1$—cathode of the first plasma lamp,
$K_2$—cathode of the second plasma lamp,
$K_3$—cathode of the third plasma lamp
$R_1$—radiation of the first plasma lamp,
$R_2$—radiation from the second plasma lamp,
$R_3$—radiation of the third plasma lamp,
OM—processed material,
ZA—power supply,
RF—radio frequency power generator,
$LA_E$—electrodeless purifying plasma lamp type E,
$LA_H$—electrodeless purifying plasma lamp type H.

The invention claimed is:

1. A method for reducing contamination in a plasma reactor, especially contamination by lubricants, the plasma reactor consisting of a chamber with reduced pressure in the form of a plasma lamp ($LA_1$, $LA_2$, $LA_3$) that generates plasma radiation directed at a material to be processes and connected by a vacuum tube to a vacuum pump (PP), wherein humid air is dosed into the chamber with reduced pressure in the form of a plasma lamp ($LA_1$, $LA_2$, $LA_3$) by a valve (V), then contaminated gas is pumped out from at least one reduced pressure vacuum chamber in the form of a plasma lamp ($LA_1$, $LA_2$, $LA_3$) to at least one purifying plasma lamp ($LA_{O1}$, $LA_{O2}$, $LA_H$, $LA_E$), then the contaminated gas is subjected to a glow discharge initiated between anodes ($A_{O1}$, $A_{O2}$) and cathodes ($K_{O1}$, $K_{O2}$) of the purifying plasma lamp ($LA_{O1}$, $LA_{O2}$, $LA_H$, $LA_E$), wherein particles of lubricants are cracked and partially polymerized, while heavy particles of lubricants are collected in a buffer tank (ZB) and then discharged outside the vacuum pump (PP).

2. A plasma reactor with a device for reducing contaminants, including contamination by lubricants, the plasma reactor comprising a chamber with reduced pressure in the form of a plasma lamp ($LA_1$, $LA_2$, $LA_3$) that generates plasma radiation directed at a material to be processed and connected by a vacuum tube to a vacuum pump (PP) and a dosing valve (V) for dosing humid air to the plasma lamp ($LA_1$, $LA_2$, $LA_3$), wherein between at least one chamber with reduced pressure in the form of the plasma lamp ($LA_1$, $LA_2$, $LA_3$) and the vacuum pump (PP) is located a device for reducing contaminants comprising at least one purifying plasma lamp ($LA_{O1}$, $LA_{O2}$, $LA_H$, $LA_E$) and a buffer tank (ZB), wherein at least one of the purifying plasma lamp ($LA_{O1}$, $LA_{O2}$, $LA_H$, $LA_{EJ}$) is equipped with power supply (ZA).

3. The plasma reactor according to claim 2 wherein at least two of the purifying plasma lamp ($LA_{O1}$, $LA_{O2}$, $LA_H$, $LA_E$) are connected in series by a vacuum tube.

4. The plasma reactor, according to claim 3 wherein one of the purifying plasma lamp is a purifying H-type electrodeless plasma lamp ($LA_H$) connected to a radio frequency power generator (RF).

5. The plasma reactor, according to claim 3 wherein one of the purifying plasma lamp is an electrodeless purifying plasma lamp of E-type ($LA_E$) connected to a radio frequency power generator (RF).

6. The plasma reactor according to claim 2 wherein the first plasma purifying lamp ($LA_{O1}$) and the second ($LA_{O2}$) plasma purifying lamp are connected with the power supply (ZA) in parallel.

* * * * *